United States Patent
Lee et al.

(10) Patent No.: US 12,004,368 B2
(45) Date of Patent: Jun. 4, 2024

(54) DISPLAY DEVICE INCLUDING THIN ENCAPSULATION LAYER CONTAINING SILICON OXYNITRIDE LAYER

(71) Applicant: SAMSUNG DISPLAY CO., LTD., Yongin-si (KR)

(72) Inventors: Juwon Lee, Asan-si (KR); Ojun Kwon, Hwaseong-si (KR); Ran Kim, Asan-si (KR); Soonmi Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 174 days.

(21) Appl. No.: 17/406,229

(22) Filed: Aug. 19, 2021

(65) Prior Publication Data
US 2022/0190286 A1 Jun. 16, 2022

(30) Foreign Application Priority Data
Dec. 10, 2020 (KR) ........................ 10-2020-0172316

(51) Int. Cl.
| | |
|---|---|
| *H10K 50/84* | (2023.01) |
| *H10K 50/844* | (2023.01) |
| *H10K 59/12* | (2023.01) |
| *G09G 3/3275* | (2016.01) |
| *G09G 3/3283* | (2016.01) |
| *G09G 3/3291* | (2016.01) |
| *H10K 59/122* | (2023.01) |
| *H10K 59/124* | (2023.01) |

(Continued)

(52) U.S. Cl.
CPC ........... *H10K 50/844* (2023.02); *H10K 59/12* (2023.02); *G09G 3/3275* (2013.01); *G09G 3/3283* (2013.01); *G09G 3/3291* (2013.01); *G09G 2300/0408* (2013.01); *H10K 59/122* (2023.02); *H10K 59/124* (2023.02); *H10K 77/111* (2023.02); *H10K 2102/311* (2023.02); *H10K 2102/361* (2023.02)

(58) Field of Classification Search
CPC .. H10K 50/844; H10K 50/8445; H10K 59/12; H10K 59/124; H10K 59/122; H10K 77/111; H10K 2102/00; H10K 2102/311; H10K 2102/361; G09G 2300/0408; G09G 3/3275; G09G 3/3283; G09G 3/3291
See application file for complete search history.

(56) References Cited

U.S. PATENT DOCUMENTS

| | | | |
|---|---|---|---|
| 10,418,598 B1 * | 9/2019 | Ni | ......................... H10K 71/135 |
| 11,456,438 B2 * | 9/2022 | Song | .................... H10K 50/844 |

(Continued)

FOREIGN PATENT DOCUMENTS

| | | | | |
|---|---|---|---|---|
| CN | 10283235 A | * | 12/2012 | ........... H10K 50/868 |
| JP | 2007194061 A | * | 8/2007 | |

(Continued)

*Primary Examiner* — Ida M Soward
(74) *Attorney, Agent, or Firm* — F. CHAU & ASSOCIATES, LLC

(57) ABSTRACT

A display device includes a light emitting structure disposed on a substrate, and a thin film encapsulation layer disposed on the light emitting structure and including an inorganic layer containing silicon oxynitride and an organic layer. A portion of the inorganic layer has a stress intensity factor of about 1.6 MPa or more.

11 Claims, 5 Drawing Sheets

(51) Int. Cl.
*H10K 77/10* (2023.01)
*H10K 102/00* (2023.01)

(56) References Cited

U.S. PATENT DOCUMENTS

| | | | | |
|---|---|---|---|---|
| 2014/0054582 | A1* | 2/2014 | Yamazaki | H01L 33/0041 |
| | | | | 257/43 |
| 2015/0021565 | A1* | 1/2015 | Min | H10K 59/12 |
| | | | | 257/40 |
| 2018/0153006 | A1* | 5/2018 | Ishida | H10K 50/844 |
| 2019/0043931 | A1* | 2/2019 | Yim | H10K 50/844 |
| 2021/0336206 | A1* | 10/2021 | Wang | H10K 50/844 |

FOREIGN PATENT DOCUMENTS

| | | | | |
|---|---|---|---|---|
| JP | 2007220646 A * | 8/2007 | | H01L 51/524 |
| JP | 6611898 B2 * | 11/2019 | | G02F 1/1339 |
| KR | 10-2015-0121662 | 10/2015 | | |
| WO | WO-2010010622 A1 * | 1/2010 | | H01L 51/524 |
| WO | WO-2016199739 A1 * | 12/2016 | | G09F 9/30 |

\* cited by examiner

DISPLAY DEVICE INCLUDING THIN ENCAPSULATION LAYER CONTAINING SILICON OXYNITRIDE LAYER

CROSS-REFERENCE TO RELATED APPLICATION(S)

This application claims priority under 35 U.S.C. § 119 to Korean Patent Application No. 10-2020-0172316, filed on Dec. 10, 2020, which is hereby incorporated by reference.

BACKGROUND

1. Filed

The inventive concept relates to a display device and a method of manufacturing the same, more specifically, a display device with improved reliability and a method of manufacturing the display device.

2. Description of the Related Art

As technology improves, display products having smaller sizes, lighter weight, and superior performance have been produced. Conventional cathode ray tube (CRT) televisions have been widely used for display devices with many advantages in terms of performance and price. Display devices such as a plasma display device, a liquid crystal display device, and an organic light emitting display device, possess technological features which overcome weak points of the CRT in terms of miniaturization or portability and have advantages such as miniaturization, light weight, and low power consumption.

The organic light emitting display device may include a thin film encapsulation layer to encapsulate an organic light emitting structure disposed on a base substrate. The thin film encapsulation layer may include an inorganic layer and an organic layer which are repeatedly arranged, and efforts have been made to improve reliability of the thin film encapsulation layer.

The above information disclosed in this Background section is only for understanding of the background of the inventive concepts, and, therefore, it may contain information that does not constitute prior art.

SUMMARY

Some embodiments provide a display device including a thin film encapsulation layer having improved reliability.

Some embodiments provide a method of manufacturing the display device.

A display device may include a light emitting structure disposed on a substrate, and a thin film encapsulation layer disposed on the light emitting structure and including an inorganic layer that contains silicon oxynitride and an organic layer. A portion of the inorganic layer may have a stress intensity factor of about 1.6 MPa or more.

According to an embodiment, the inorganic layer may have a refractive index of about 1.8 or less.

According to an embodiment, the inorganic layer may include a first inorganic layer disposed between the light emitting structure and the organic layer and containing silicon oxynitride, and a second inorganic layer disposed on the organic layer and containing silicon oxynitride.

According to an embodiment, a portion of the first inorganic layer may have a stress intensity factor of about 1.6 MPa or more.

According to an embodiment, a portion of the second inorganic layer may have a stress intensity factor of about 1.6 MPa or more.

According to an embodiment, the inorganic layer may include a first barrier layer having a stress intensity factor of about 1.6 MPa or more and a second barrier layer having a stress intensity factor of less than about 1.6 MPa.

According to an embodiment, the first barrier layer may be disposed on the second barrier layer, and may be disposed between the second barrier layer and the organic layer.

According to an embodiment, the first barrier layer may be disposed on the second barrier layer disposed on the organic layer.

According to an embodiment, a difference between a refractive index of the first barrier layer and a refractive index of the second barrier layer may be less than about 0.05.

A display device may include a light emitting structure disposed on a substrate, and a thin film encapsulation layer disposed on the light emitting structure and including an inorganic layer that contains silicon oxynitride and an organic layer. A portion of the inorganic layer may have a spin density of less than about $9.0 \times 10^{18}$ spins/cm$^3$.

According to an embodiment, the inorganic layer may include a first barrier layer having a spin density of less than about $9.0 \times 10^{18}$ spins/cm$^3$ and a second barrier layer having a spin density of about $9.0 \times 10^{18}$ spins/cm$^3$ or more.

According to an embodiment, the first barrier layer may be disposed on the second barrier layer.

According to an embodiment, the first barrier layer may have a stress intensity factor of about 1.6 MPa or more. The second barrier layer may have a stress intensity factor of less than about 1.6 MPa.

According to an embodiment, each of a refractive index of the first barrier layer and a refractive index of the second barrier layer may be about 1.8 or less. A difference between the refractive index of the first barrier layer and the refractive index of the second barrier layer may be less than about 0.05.

According to an embodiment, the first barrier layer may be not oxidized under a temperature of about 85° C. and a humidity of about 85% for about 500 hours.

A method of manufacturing a display device may include forming a light emitting structure on a substrate, forming a thin film encapsulation layer including an inorganic layer that contains silicon oxynitride and an organic layer to cover the light emitting structure, and treating a portion of the inorganic layer with hydrogen (H$_2$) plasma.

According to an embodiment, the treating the portion of the inorganic layer with hydrogen (H$_2$) plasma may reduce a number of dangling bonds of the inorganic layer.

According to an embodiment, the forming the thin film encapsulation layer may include forming a first inorganic layer containing silicon oxynitride on the light emitting structure, forming the organic layer on the first inorganic layer, and forming a second inorganic layer containing silicon oxynitride on the organic layer.

According to an embodiment, the treating the portion of the inorganic layer with hydrogen (H$_2$) plasma may include treating a portion of the first inorganic layer with hydrogen (H$_2$) plasma.

According to an embodiment, the treating the portion of the inorganic layer with hydrogen (H$_2$) plasma may include treating a portion of the second inorganic layer with hydrogen (H$_2$) plasma.

Therefore, by treating a portion of the inorganic layer included in the thin film encapsulation layer with hydrogen plasma, the number of dangling bonds of the inorganic layer may be reduced. Accordingly, sealing property and mechanical strength of the inorganic layer may be improved without significantly reducing transmittance of the inorganic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Illustrative, non-limiting embodiments will be more clearly understood from the following detailed description in conjunction with the accompanying drawings.

Figure 1:
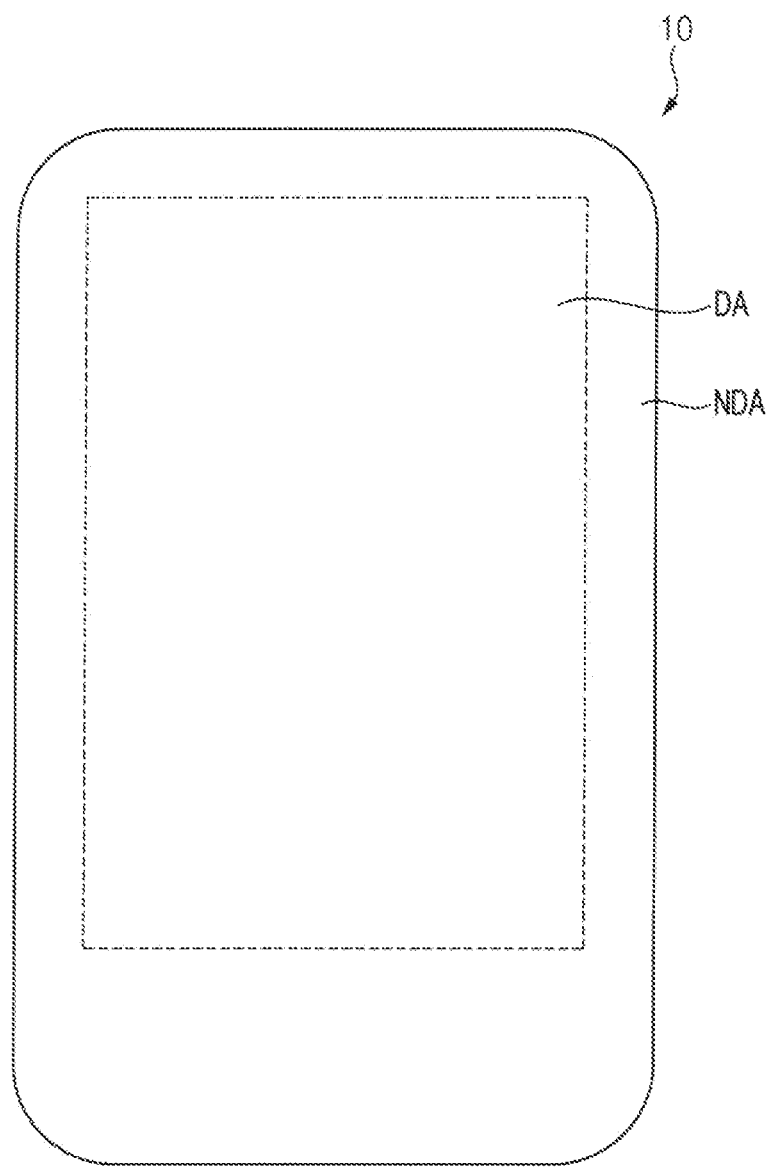
FIG. 1 is a plan view illustrating an embodiment of a display device according to an embodiment of the present inventive concept.

FIG. 1 is a plan view illustrating an embodiment of a display device 10.

Referring to FIG. 1, a display device 10 may be divided into a display area DA and a non-display area NDA.

In an embodiment, a plurality of pixels may be disposed in the display area DA. The pixels may be entirely arranged in the display area DA in a matrix form. The form in which the pixels are arranged is exemplary, and the pixels may be arranged in various forms in the display area DA. The display device 10 may display an image on the display area DA through the pixels. The display device 10 may be an organic light emitting display device, a liquid crystal display device, an electrophoretic display device, a plasma display device, or the like.

Drivers (e.g. a gate driver and/or a data driver) may be disposed in the non-display area NDA. Various electronic devices such as an integrated circuit or a printed circuit board may be electrically connected to the non-display area NDA. The non-display area NDA may be disposed to surround the display area DA on a plane.

Figure 2:
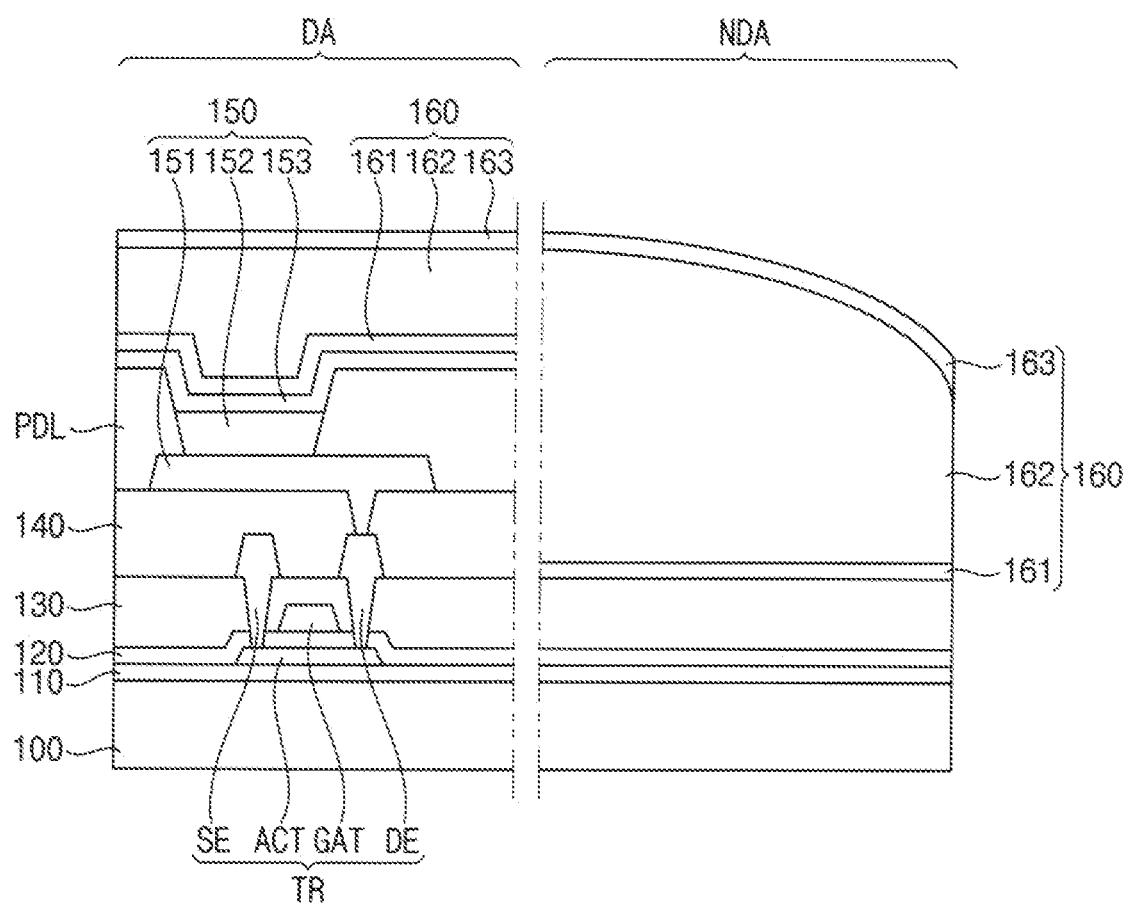
FIG. 2 is a cross-sectional view the display device of FIG. 1 according to an embodiment of the present inventive concept.

FIG. 2 is a cross-sectional view the display device 10 of FIG. 1. FIG. 2 may illustrate the display area DA and the non-display area NDA of the display device 10.

Referring to FIG. 2, the display device 10 may include a substrate 100, a buffer layer 110, a transistor TR, a gate insulating layer 120, an interlayer insulating layer 130, a via insulating layer 140, a light emitting structure 150, a pixel defining layer PDL, and a thin film encapsulation layer 160. The transistor TR and the light emitting structure 150 may be disposed in the display area DA. The transistor TR may include an active layer ACT, a gate electrode GAT, a source electrode SE, and a drain electrode DE. The light emitting structure 150 may include a lower electrode layer 151, an intermediate layer 152, and an upper electrode layer 153.

In an embodiment, the substrate 100 may include or may be a glass substrate, a quartz substrate, a plastic substrate, or the like. When the substrate 100 is a plastic substrate, the substrate 100 may include or may be formed of various materials having flexible, bendable, or rollable properties. For example, the substrate 100 may include or may be formed of polymer resin. The polymer resin may be at least one selected from the group consisting of polyethersulphone, polyacrylate, polyetherimide, polyethylene naphthalate, polyethylene terephthalate, polyphenylene sulfide, polyarylate, polyimide, polycarbonate, and cellulose acetate propionate. These may be used alone or in combination with each other. The substrate 100 may have a multilayer structure including two layers including the polymer resin and a barrier layer including an inorganic material disposed between the layers. The barrier layer may include or may be formed of at least one selected from the group consisting of silicon oxide ($SiO_x$), silicon nitride ($SiN_x$), and silicon oxynitride ($SiO_xN_y$). Accordingly, the substrate 100 may be a single layer structure or a multilayer structure.

The buffer layer 110 may be disposed on the substrate 100. The buffer layer 110 may prevent diffusion of metal atoms or impurities from the substrate 100 to the active layer ACT of the transistor TR. In addition, during the crystallization process of forming the active layer ACT, the buffer layer 110 may serve to control the heat supply rate to uniformly form the active layer ACT.

The active layer ACT may be disposed on the buffer layer 110. In an embodiment, the active layer ACT may include or may be formed of a silicon semiconductor. For example, the silicon semiconductor may include or may be formed of amorphous silicon, polycrystalline silicon, or the like. In an embodiment, the active layer ACT may include or may be formed of an oxide semiconductor. The oxide semiconductor may include or may be formed of at least one selected from the group consisting of zinc oxide, indium oxide, gallium oxide, tin oxide, titanium oxide, and phosphorus oxide. Zinc oxide, indium oxide, gallium oxide, tin oxide, titanium oxide, and phosphorus oxide may be used alone or in combination with each other. For example, the oxide semiconductor may include or may be formed of zinc-tin oxide, zinc-indium oxide, indium-gallium-zinc oxide (IGZO), indium-zinc-tin oxide (IZTO), or the like.

The gate insulating layer 120 may be disposed on the active layer ACT. The gate insulating layer 120 may serve to insulate the active layer ACT and the gate electrode GAT. The gate insulating layer 120 may include or may be formed of an insulating material. For example, the gate insulating layer 120 may include or may be formed of silicon oxide, silicon nitride, silicon oxynitride, titanium oxide, tantalum oxide, or the like.

The gate electrode GAT may be disposed on the gate insulating layer 120. A gate signal for applying an on/off signal to the transistor TR may be applied to the gate electrode GAT. The gate electrode GAT may include or may be formed of metal, an alloy, a conductive metal oxide, a transparent conductive material, or the like. For example, the gate electrode GAT may include or may be formed of silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, or the like.

The interlayer insulating layer 130 may be disposed on the gate electrode GAT. The interlayer insulating layer 130 may serve to insulate the gate electrode GAT, the source electrode SE, and the drain electrode DE. The interlayer insulating layer 130 may include or may be formed of an insulating material. For example, the interlayer insulating layer 130 may include or may be formed of silicon oxide, silicon nitride, silicon oxynitride, titanium oxide, tantalum oxide, or the like.

The source electrode SE and the drain electrode DE may be disposed on the interlayer insulating layer 130. Depending on the gate signal of the gate electrode GAT, the source electrode SE may transmit a signal to a channel region of the active layer ACT. The drain electrode DE may receive the signal transmitted to the channel region and may transmit the signal to the lower electrode layer 151. Each of the source electrode SE and the drain electrode DE may contact the active layer ACT through a first contact hole penetrating the interlayer insulating layer 130 and the gate insulating layer 120.

The via insulating layer 140 may be disposed on the source electrode SE and the drain electrode DE. The via insulating layer 140 may include or may be formed of an organic insulating material. For example, the via insulating layer 140 may include or may be formed of a photoresist, a polyacrylic resin, a polyimide resin, an acrylic resin, or the like. An upper surface of the via insulating layer 140 may be substantially flat. The "substantially flat" may be exactly flat, or may be flat within acceptable variations that may occur, for example, due to manufacturing processes.

The lower electrode layer 151 may be disposed on the via insulating layer 140. The lower electrode layer 151 may include or may be formed of metal, an alloy, a conductive metal oxide, a transparent conductive material, or the like. The lower electrode layer 151 may be connected to the drain electrode DE by a second contact hole penetrating the via insulating layer 140. In an embodiment, the lower electrode layer 151 may be used as an anode electrode. In an embodiment, the lower electrode layer 151 may be used as a cathode electrode.

The pixel defining layer PDL may be disposed on the lower electrode layer 151. The pixel defining layer PDL may partition the emission area of each pixel. The pixel defining layer PDL may be an organic insulating layer including or being formed of an organic material. For example, the pixel defining layer PDL may include or may be formed of an organic insulating material such as a polyacrylic compound, a polyimide compound, a fluorine-based carbon compound such as Teflon, and a benzocyclobutene compound. The pixel defining layer PDL may include an opening exposing an upper surface of the lower electrode layer 151.

The intermediate layer 152 may be disposed on the lower electrode layer 151. The intermediate layer 152 may be provided as a single layer, but may be provided as a multilayer including various functional layers. The intermediate layer 152 may have a structure in which a hole injection layer, a hole transport layer, an emission layer, an electron transport layer, and an electron injection layer are stacked in a single or complex structure.

The upper electrode layer 153 may be disposed on the intermediate layer 152. The upper electrode layer 153 may cover the pixel defining layer PDL on the intermediate layer 152. In an embodiment, the upper electrode layer 153 may be used as a cathode electrode. In an embodiment, the upper electrode layer 153 may be used as an anode electrode.

The thin film encapsulation layer 160 may be disposed on the upper electrode layer 153. For example, the thin film encapsulation layer 160 may be disposed on the light emitting structure 150. The thin film encapsulation layer 160 may prevent penetration of external moisture and oxygen into the light emitting structure 150. The thin film encapsulation layer 160 may include or may be formed of an inorganic layer and an organic layer. The inorganic layer and the organic layer may be alternately stacked with each other. In an embodiment, the thin film encapsulation layer 160 may include a first inorganic layer 161, an organic layer 162 disposed on the first inorganic layer 161, and a second inorganic layer disposed on the organic layer 162, but the invention is not limited thereto. For example, the thin film encapsulation layer 160 may include the first inorganic layer 161 and the second inorganic layer 163 disposed on the first inorganic layer 161. For example, the organic layer 162 may be omitted from the thin film encapsulating layer 160.

Meanwhile, since the inorganic layer of the thin film encapsulation layer 160 is brittle, mechanical property against stress may be weak. For example, stress (e.g., an external impact) may cause damage to the thin film encapsulation layer 160, thereby allowing penetration of external moisture and oxygen into the light emitting structure 150. For example, in a manufacturing process of the light emitting structure 150, a plurality of particles may be generated. Since the inorganic layer on the particles is highly affected by stress, cracks may be generated in the inorganic layer.

A sealing capability to prevent penetration of moisture and oxygen and a mechanical strength to prevent cracks may be important properties of the thin film encapsulation layer 160. Since the thin film encapsulation layer 160 is disposed on the light emitting structure 150, a transmittance of light may also be an important property. Accordingly, the sealing capability, the mechanical strength, and the transmittance of the thin film encapsulation layer 160 may be desirable to improve.

A defect density may be an index for determining the sealing property. The defect density may mean a degree of defects of atoms in the inorganic layer of the thin film encapsulation layer 160. For example, the defect density may correspond to the degree of bonding between the inorganic layer and the moisture and oxygen atoms due to the penetration of moisture and oxygen into the inorganic layer. For example, when the inorganic layer combines with moisture and oxygen atoms to generate the defect, display quality of the display device 10 may be deteriorated, resulting in the defect in image quality. Accordingly, if the defect density is low, the thin film encapsulation layer 160 has fewer defects through which moisture and oxygen may penetrate, and thus the sealing property may be high. A spin density may be a measure of determining the defect density. Therefore, the lower the spin density, the lower the defect density, and thus, the sealing capability may be higher. The spin density may be measured using an ESR (electron spin resonance spectrometer) instrument.

The stress intensity factor may be a measure of determining the mechanical strength. For example, the stress intensity factor may correspond to the energy required to generate the cracks due to the stress caused by the particles. The greater the stress intensity factor, the greater the energy required generating the cracks, and thus the mechanical strength may be high. For example, when the stress intensity factor is large, the cracks do not occur, or even if the cracks occur, the length of the cracks may be short (i.e., the propagation of cracks may be suppressed).

A refractive index may be a measure for determining the transmittance. The lower the refractive index is, the less refraction of the transmitted light is, the less change in the path of the light is, so the transmittance may be higher.

As the material of the inorganic layer, silicon nitride ($SiN_x$) has better sealing capability and the mechanical strength than silicon oxynitride ($SiO_xN_y$). For example, the stress intensity factor of silicon nitride may be about 1.68 MPa, and the stress intensity factor of silicon oxynitride may range from about 1.31 MPa to about 1.43 MPa depending on the nitrogen (N) content. Accordingly, the mechanical strength of silicon nitride may be higher than the mechanical strength of silicon oxynitride. The spin density of silicon nitride may be about $2.99 \times 10^{19}$ spins/cm$^3$, and the spin density of silicon oxynitride may be from about $9.8 \times 10^{18}$ spins/cm$^3$ to about $1.06 \times 10^{19}$ spins/cm$^3$ depending on the nitrogen content. Accordingly, since the defect density of silicon nitride is lower than the defect density of silicon oxynitride, the sealing capability of silicon nitride may be higher than the sealing property of silicon oxynitride. Terms such as "about" or "approximately" may reflect amounts or sizes that vary (e.g., 0%-5% deviation) without significantly altering functionality of certain elements.

However, the transmittance of silicon nitride may be lower than the transmittance of silicon oxynitride. For example, the refractive index of silicon nitride may be greater than about 1.8, and the refractive index of silicon oxynitride may be a value from about 1.4 to about 1.8. Accordingly, when silicon oxynitride is used as the inorganic layer of the thin film encapsulation layer 160, the transmittance is high, so that the display quality of the display device 10 may be improved.

Therefore, for better transmittance, research on which inorganic material is used as the material of the inorganic layer of the thin film encapsulation layer 160 is ongoing. Accordingly, the invention may provide improving the sealing capability and the mechanical strength while using silicon oxynitride having high transmittance as the material of the inorganic layer.

Figure 3:
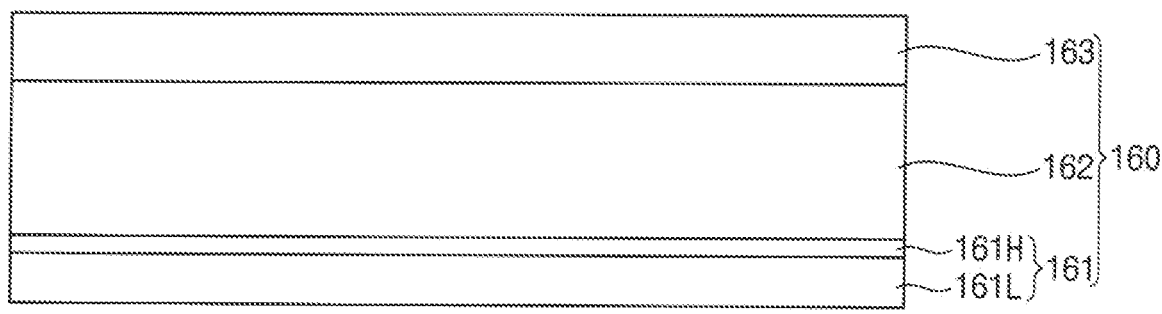
FIG. 3 is an enlarged cross-sectional view illustrating an embodiment of the thin film encapsulation layer of FIG. 2 according to an embodiment of the present inventive concept.

FIG. 3 is an enlarged cross-sectional view illustrating a first embodiment of the thin film encapsulation layer 160 of FIG. 2.

Referring to FIG. 3, the thin film encapsulation layer 160 may include or may be formed of the first inorganic layer 161, the organic layer 162 disposed on the first inorganic layer 161, and the second inorganic layer 163 disposed on the organic layer 162, but the invention is not limited thereto. For example, the thin film encapsulation layer 160 may include or may be formed of the first inorganic layer 161 and the second inorganic layer 163 disposed on the first inorganic layer 161. For example, the organic layer 162 may be omitted from the thin film encapsulation layer 160. The first inorganic layer 161 and the second inorganic layer 163 may include or may be formed of silicon oxynitride.

The first inorganic layer 161 may include or may be formed of a second barrier layer 161L and a first barrier layer 161H disposed on the second barrier layer 161L. The first barrier layer 161H may be formed by performing plasma treatment using hydrogen ($H_2$) on the first inorganic layer 161. Accordingly, the number of dangling bonds of the first inorganic layer 161 may be reduced. For example, the first barrier layer 161H may be formed by combining free radicals or outermost electrons present on a surface of the first inorganic layer 161 with hydrogen of the plasma. The first barrier layer 161H may mean an upper portion of the first inorganic layer 161 that is affected by plasma using hydrogen. For example, the first barrier layer 161H may be a silicon oxynitride layer treated with plasma of hydrogen. The second barrier layer 161L may mean a lower portion of the first inorganic layer 161 that is not affected by plasma using hydrogen. For example, the second barrier layer 161L may be a silicon oxynitride layer as deposited, without being treated with plasma of hydrogen. Since the first inorganic layer 161 includes the first barrier layer 161H that is affected by plasma using hydrogen, the sealing capability and mechanical strength may be improved compared to if the first barrier layer 161H is as deposited, without being treated by plasma using hydrogen.

A portion of the first inorganic layer 161 may have a stress intensity factor of about 1.6 MPa or more. For example, the portion of the first inorganic layer 161 having the stress intensity factor of about 1.6 MPa or more may be the first barrier layer 161H. For example, the stress intensity factor of the first barrier layer 161H may be about 1.68 MPa. The other portion of the first inorganic layer 161 may have a stress intensity factor of less than about 1.6 MPa. For example, the other portion of the first inorganic layer 161 having the stress intensity factor of less than about 1.6 MPa may be the second barrier layer 161L.

A portion of the first inorganic layer 161 may have a spin density of less than about $9.0 \times 10^{18}$ spins/cm$^3$. For example, the portion of the first inorganic layer 161 having the spin density of less than about $9.0 \times 10^{18}$ spins/cm$^3$ may be the first barrier layer 161H. In an embodiment, the spin density of the first barrier layer 161H may be about $8.56 \times 10^{18}$ spins/cm$^3$. The other portion of the first inorganic layer 161 may have a spin density of about $9.0 \times 10^{18}$ spins/cm$^3$ or more. The other portion of the first inorganic layer 161 having the spin density of about $9.0 \times 10^{18}$ spins/cm$^3$ or more may be the second barrier layer 161L.

A refractive index of the first inorganic layer 161 may be about 1.8 or less. For example, the refractive index of the first barrier layer 161H and the refractive index of the second barrier layer 161L may be about 1.8 or less. A difference between the refractive index of the first barrier layer 161H and the refractive index of the second barrier layer 161L may be less than about 0.05. In an embodiment, the refractive index of the second barrier layer 161L may be about 1.64, and the refractive index of the first barrier layer 161H may be about 1.66.

The first inorganic layer 161 may have a large stress intensity factor and a small spin density even though there is no significant difference in the refractive index of the first inorganic layer 161. For example, even though the first inorganic layer 161 includes the first barrier layer 161H, the transmittance is excellent, and the first inorganic layer 161 includes the first barrier layer 161H, thereby providing the sealing capability and the mechanical strength.

Figure 4:
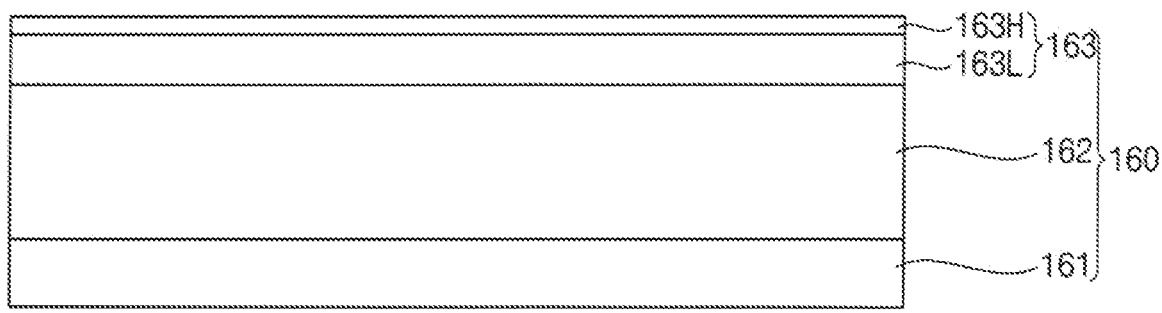
FIG. 4 is an enlarged cross-sectional view illustrating an embodiment of the thin film encapsulation layer of FIG. 2 according to an embodiment of the present inventive concept.

FIG. 4 is an enlarged cross-sectional view illustrating an embodiment of the thin film encapsulation layer 160 of FIG. 2.

Referring to FIG. 4, the thin film encapsulation layer 160 may include or may be formed of the first inorganic layer 161, the organic layer 162, disposed on the first inorganic layer 161, and the second inorganic layer 163 disposed on the organic layer 162. But the invention is not limited thereto. For example, the thin film encapsulation layer 160 may include or may be formed of the first inorganic layer 161 and the second inorganic layer 163 disposed on the first inorganic layer 161. For example, the organic layer 162 may be omitted from the thin film encapsulation layer 160. The first inorganic layer 161 and the second inorganic layer 163 may include or may be formed of silicon oxynitride.

The second inorganic layer 163 may include or may be formed of a second barrier layer 163L and a first barrier layer 163H disposed on the second barrier layer 163L. The first barrier layer 163H may be formed by performing plasma treatment using hydrogen ($H_2$) on the second inorganic layer 163. Accordingly, the number of dangling bonds of the second inorganic layer 163 may be reduced. The first barrier layer 163H may be formed by combining free radicals or outermost electrons present on a surface of the second inorganic layer 163 with hydrogen of the plasma. The first barrier layer 163H may mean an upper portion of the second inorganic layer 163 that is affected by plasma using hydrogen. For example, the first barrier layer 163H may be a silicon oxynitride layer treated with plasma using hydrogen. The second barrier layer 163H may mean a lower portion of the second inorganic layer 163 that is not affected by plasma using hydrogen. For example, the second barrier layer 163L may be a silicon oxynitride layer as deposited, without being treated with plasma using hydrogen. Since the second inorganic layer 163 includes the first barrier layer 163H that is affected by plasma using hydrogen, the sealing capability and mechanical strength may be improved.

A portion of the second inorganic layer 163 may have a stress intensity factor of about 1.6 MPa or more. For example, the portion of the second inorganic layer 163 having the stress intensity factor of about 1.6 MPa or more may be the first barrier layer 163H. In an embodiment, the stress intensity factor of the first barrier layer 163H may be about 1.68 MPa. The other portion of the second inorganic layer 163 may have a stress intensity factor of less than about 1.6 MPa. The other portion of the second inorganic layer 163 having the stress intensity factor of less than about 1.6 MPa may be the second barrier layer 163L.

A portion of the second inorganic layer 163 may have a spin density of less than about $9.0 \times 10^{18}$ spins/$cm^3$. The portion of the second inorganic layer 163 having the spin density of less than about $9.0 \times 10^{18}$ spins/$cm^3$ may be the first barrier layer 163H. For example, the spin density of the first barrier layer 163H may be about $8.56 \times 10^{18}$ spins/$cm^3$. The other portion of the second inorganic layer 163 may have a spin density of about $9.0 \times 10^{18}$ spins/$cm^3$ or more. The other portion of the second inorganic layer 163 having the spin density of about $9.0 \times 10^{18}$ spins/$cm^3$ or more may be the second barrier layer 163L.

A refractive index of the second inorganic layer 163 may be about 1.8 or less. For example, the refractive index of the first barrier layer 163H and the refractive index of the second barrier layer 163L may be about 1.8 or less. A difference between the refractive index of the first barrier layer 163H and the refractive index of the second barrier layer 163L may be less than about 0.05. In an embodiment, the refractive index of the second barrier layer 163L may be about 1.64, and the refractive index of the first barrier layer 163H may be about 1.66.

The second inorganic layer 163 may have a large stress intensity factor and a small spin density even though there is no significant difference in the refractive index of the second inorganic layer 163. For example, even though the second inorganic layer 163 includes the first barrier layer 163H, the transmittance is excellent, and the second inorganic layer 163 includes the first barrier layer 163H, thereby providing the sealing capability and the mechanical strength.

Figure 5:
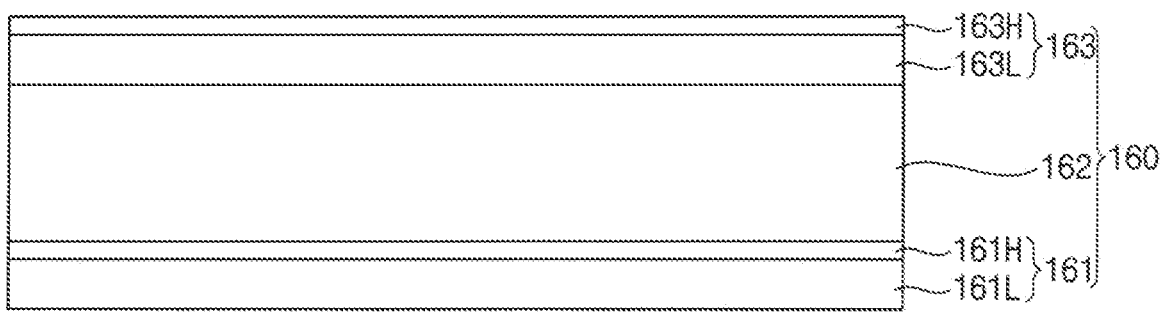
FIG. 5 is an enlarged cross-sectional view illustrating an embodiment of the thin film encapsulation layer of FIG. 2 according to an embodiment of the present inventive concept.

FIG. 5 is an enlarged cross-sectional view illustrating a third embodiment of the thin film encapsulation layer of FIG. 2.

Referring to FIG. 5, the thin film encapsulation layer 160 may include or may be formed of the first inorganic layer 161, the organic layer 162 disposed on the first inorganic layer 161, and the second inorganic layer 163 disposed on the organic layer 162, but the invention is not limited thereto. For example, the thin film encapsulation layer 160 may include or may be formed of the first inorganic layer 161 and the second inorganic layer 163 disposed on the first inorganic layer 161. For example, the organic layer 162 may be omitted from the thin film encapsulation layer 160. The first inorganic layer 161 and the second inorganic layer 163 may include or may be formed of silicon oxynitride.

The first inorganic layer 161 may include or may be formed of a second barrier layer 161L and a first barrier layer 161H disposed on the second barrier layer 161L, and the second inorganic layer 163 may include or may be formed of a second barrier layer 163L and a first barrier layer 161H. The first barrier layers 161H and 163H may be formed by performing plasma treatment using hydrogen ($H_2$) on the first and the second inorganic layers 161 and 163, respectively. Accordingly, the number of dangling bonds of each of the first and the second inorganic layers 161 and 163 may be reduced. For example, the first barrier layers 161H and 163H may be formed by combining free radicals or outermost electrons present on a surface of each of the first and the second inorganic layers 161 and 163 with hydrogen of the plasma. The first barrier layers 161H and 163H may mean upper portions of the first and the second inorganic layers 161 and 163, respectively, that are affected (i.e., treated) by plasma using hydrogen. For example, each of the first barrier layers 161H and 163H may be a silicon oxynitride layer treated with plasma using hydrogen. The second barrier layers 161H and 163H may mean lower portions of the first and the second inorganic layers 161 and 163, respectively, that are not affected by plasma using hydrogen. For example, each of the second barrier layers 161L and 163L may be a silicon oxynitride layer as deposited, without being treated with plasma using hydrogen. Since each of the first and the second inorganic layers 161 and 163 includes each of the first barrier layers 161H and 163H that are affected by plasma using hydrogen, the sealing capability and mechanical strength may be improved.

A portion of the first inorganic layer 161 may have a stress intensity factor of about 1.6 MPa or more. The portion of the first inorganic layer 161 having the stress intensity factor of about 1.6 MPa or more may be the first barrier layer 161H. For example, the stress intensity factor of the first barrier layer 161H may be about 1.68 MPa. The other portion of the first inorganic layer 161 may have a stress intensity factor of less than about 1.6 MPa. For example, the other portion of the first inorganic layer 161 having the stress intensity factor of less than about 1.6 MPa may be the second barrier layer 161L.

A portion of each of the first and the second inorganic layers 161 and 163 may have a spin density of less than about $9.0\times10^{18}$ spins/cm$^3$. For example, the portions of the first and the second inorganic layers 161 and 163 having the spin density of less than about $9.0\times10^{18}$ spins/cm$^3$ may be the first barrier layers 161H and 163H, respectively. For example, the spin density of each of the first barrier layers 161H and 163H may be about $8.56\times10^{18}$ spins/cm$^3$. The other portion of each of the first and the second inorganic layers 161 and 163 may have a spin density of about $9.0\times10^{18}$ spins/cm$^3$ or more. For example, the other portions of the first and the second inorganic layers 161 and 163 having the spin density of about $9.0\times10^{18}$ spins/cm$^3$ or more may be the second barrier layers 161L and 163L, respectively.

A refractive index of each of the first and the second inorganic layers 161 and 163 may be about 1.8 or less. For example, the refractive indices of the first barrier layers 161H and 163H and the refractive indices of the second barrier layers 161L and 163L may be about 1.8 or less. A difference between the refractive indices of the first barrier layers 161H and 163H and the refractive indices of the second barrier layers 161L and 163L may be less than about 0.05. For example, the refractive indices of the second barrier layers 161L and 163L may be about 1.64, and the refractive indices of the first barrier layers 161H and 163H may be about 1.66.

Each of the first and the second inorganic layers 161 and 163 may have a large stress intensity factor and a small spin density even though there is no significant difference in the refractive indices of each of the first and the second inorganic layers 161 and 163. For example, even though the first and the second inorganic layers 161 and 163 include the first barrier layer 161H or 163H, respectively, the transmittance is excellent, and the first and the second inorganic layers 161 and 163 include the first barrier layer 161H and 163H, respectively, thereby providing the sealing capability and the mechanical strength.

Figure 6:
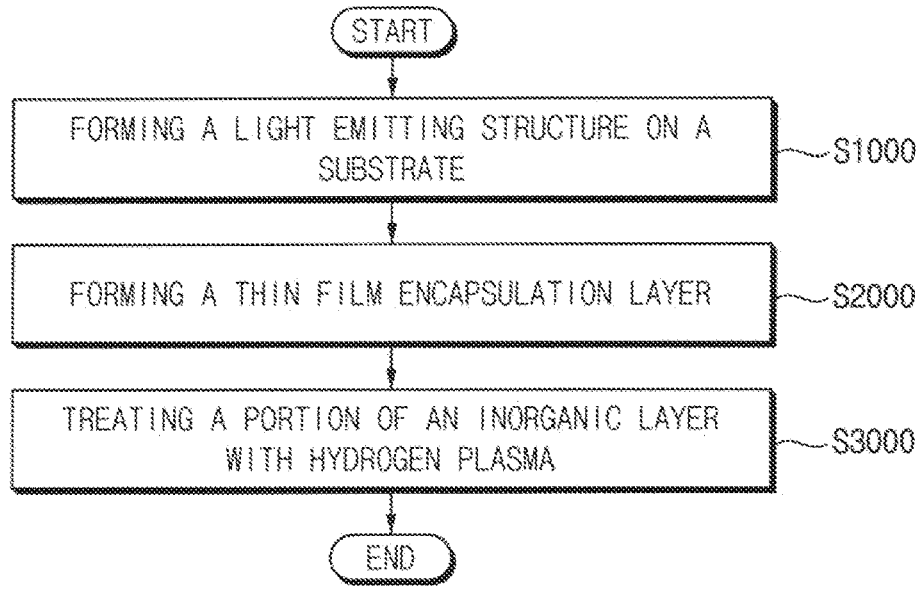
FIG. 6 is a flow chart illustrating an embodiment of a method of manufacturing a display device according to an embodiment of the present inventive concept.

FIG. 6 is a flow chart illustrating an embodiment of a method of manufacturing a display device.

Referring to FIGS. 2 and 6, a method of manufacturing the display device 10 may include forming the light emitting structure 150 on the substrate 100 (S1000), forming the thin film encapsulation layer 160 (S2000), and treating a portion of the inorganic layer with hydrogen plasma (S3000).

In step of S1000, the light emitting structure 150 including the lower electrode layer 151 (e.g. anode electrode), intermediate layer 152, and the upper electrode layer 153 (e.g. cathode electrode) may be formed after forming the buffer layer 110, the transistor TR, and the insulating layer.

In step of S2000, the thin film encapsulation layer 160 including the inorganic layer and the organic layer may be formed. In an embodiment, the forming of the thin film encapsulation layer 160 (S2000) may include forming the first inorganic layer 161 on the light emitting structure 150, forming the organic layer 162 on the first inorganic layer 161, and forming the second inorganic layer 163 on the organic layer 162. But the invention is not limited thereto. For example, the forming of the thin film encapsulation layer 160 (S2000) may include the forming the first inorganic layer 161 on the light emitting structure 150 and forming the second inorganic layer 163 on the first inorganic layer 161. For example, the organic layer 162 is not formed in step of S2000.

In step of S3000, the portion of the inorganic layer (e.g. the first inorganic layer 161 or the second inorganic layer 163) may be treated by hydrogen plasma after forming the inorganic layer. Accordingly, the number of dangling bonds of the inorganic layer may be reduced. For example, free radicals or outermost electrons present on a surface of the inorganic layer may be combined with hydrogen of the plasma.

Compared to before the treating with hydrogen plasma, as the dangling bonds of the inorganic layer decrease, an upper portion of the inorganic layer may be changed to a first barrier layer. As the dangling bonds decrease in the first barrier layer, a stress intensity factor may increase and a spin density may decrease. On the other hand, compared to before the treating with hydrogen plasma, the treatment of hydrogen plasma may barely or slightly increase a refractive index of the first barrier layer such that the transmittance of the first barrier layer may barely change compared to the first barrier without being treated with hydrogen plasma. For example, as the upper portion of the inorganic layer is changed to the first barrier layer by treating with hydrogen plasma, sealing capability and mechanical strength are improved, and transmittance may still be excellent.

As the dangling bonds of the inorganic layer are reduced by treating the upper portion of the inorganic layer with hydrogen plasma, the inorganic layer including the first barrier layer may have the stress intensity factor of about 1.6 MPa or more, and may have the spin density of less than about $9.0\times10^{18}$ spins/cm$^3$, and may have the refractive index of less than about 1.8. For example, the inorganic layer including the first barrier layer may have the stress intensity factor of about 1.68 MPa, the spin density of about $8.56\times10^{18}$ spins/cm$^3$, and the refractive index of about 1.66.

Since the thin film encapsulation layer 160 of the display device 10 includes the inorganic layer including the first barrier layer, the crack may barely occur in the thin film encapsulation layer 160 or even if the crack occurs, the length of the crack may be short. Accordingly, the possibility that the image quality displayed by the display device 10 is defective may be reduced, and the display device 10 may have excellent display quality due to a high transmittance of light.

When wet high temperature storage ("WHTS") is performed under a temperature of about 85° C. and a humidity of about 85% for about 500 hours, an inorganic layer that has not undergone hydrogen plasma treatment (e.g., step S3000) may be oxidized. On the other hand, when the WHTS for about 500 hours is performed, the inorganic layer that has undergone hydrogen plasma treatment (e.g., step S3000) is not oxidized. The oxidation of the inorganic layer that has not undergone the treating of a portion of the inorganic layer with hydrogen plasma may be confirmed by analyzing a chemical state using an analysis facility XPS (X-ray photoelectron spectroscopy). When the inorganic layer that has not undergone the hydrogen plasma (e.g., step of S3000) undergoes the WHTS for about 500 hours, a composition of oxygen atom may increase in silicon oxynitride and a composition of nitrogen atom may decrease in silicon oxynitride. A peak of $SiO_xN_y$ may change to a peak of $SiO_2$ in the chemical state of silicon atom in the XPS analysis. In the state of chemical bonding of oxygen atom, the peak of $SiO_2$ may increase in the XPS analysis. Each of peaks of $NO_x$, $SiN_x$, and N—H may decrease in the state of chemical bonding of nitrogen atom in the XPS analysis. Therefore, it may be predicted that the inorganic layer is oxidized by a following reaction equation.

$$SiO_xN_y + H_2O \rightarrow SiO_x + NH_x(g) + NO_x(g) + N_2(g) + H_2(g)$$ Reaction equation:

On the other hand, when the inorganic layer that has undergone hydrogen plasma treatment (e.g., step of S3000) undergoes the WHTS for about 500 hours, each of the compositions of oxygen atom, nitrogen atom, and silicon atom may barely change. Therefore, it may be predicted that the inorganic layer is not oxidized. That the inorganic layer that has undergone the hydrogen plasma treatment (e.g., step of S3000) is not oxidized under the WHTS for about 500 hours may mean that the sealing capability is improved as the upper portion of the inorganic layer is changed to the first barrier layer.

As an experimental example, when the WHTS for about 1000 hours is performed, in the display panel including the inorganic layer that has not undergone the hydrogen plasma (e.g., step of S3000), image quality defects may be found in 17 cells out of 20 cells. For example, the image quality defect rate is 85%. On the other hand, when the WHTS for about 1000 hours is performed, in the display panel including the inorganic layer that has undergone the hydrogen plasma treatment (e.g., step of S3000), image quality defects may be found in only 3 cells out of 20 cells. For example, the image quality defect rate is 15%. Accordingly, the sealing capability of the inorganic layer that has undergone the hydrogen plasma treatment may be improved.

Figure 7:
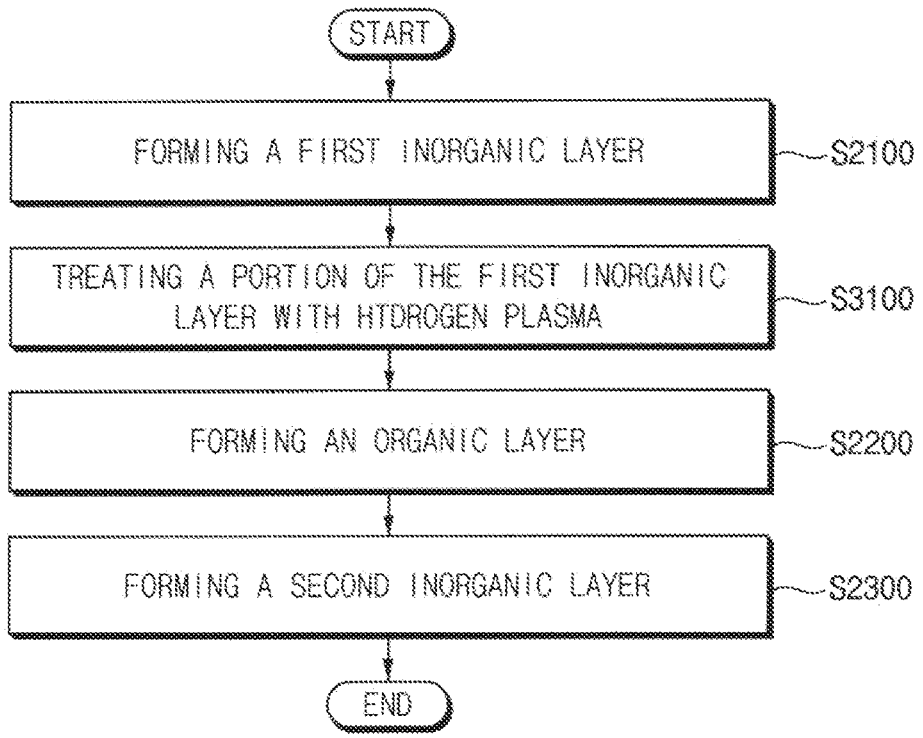
FIG. 7 is a flow chart illustrating an embodiment of the method of manufacturing the display device after forming a light emitting structure on a substrate according to an embodiment of the present inventive concept.

FIG. 7 is a flow chart illustrating an embodiment of the method of manufacturing the display device 10 after forming S1000 a light emitting structure 150 on a substrate 100.

Referring to FIGS. 3 and 7, after step of S1000 is performed, forming of a first inorganic layer 161 (S2100), treating of a portion of the first inorganic layer 161 with hydrogen plasma (S3100), forming of an organic layer 162 (S2200), and forming a second inorganic layer 163 (S2300) may be performed. Accordingly, by changing the upper portion of the first inorganic layer 161, the first inorganic layer 161 may include the first barrier layer 161H and the second barrier layer 161L. In an embodiment, the first barrier layer 161H may be a portion of the first inorganic layer 161 which is treated with hydrogen plasma, and the second barrier layer 161L may be the remaining portion of the first inorganic layer 161.

Figure 8:
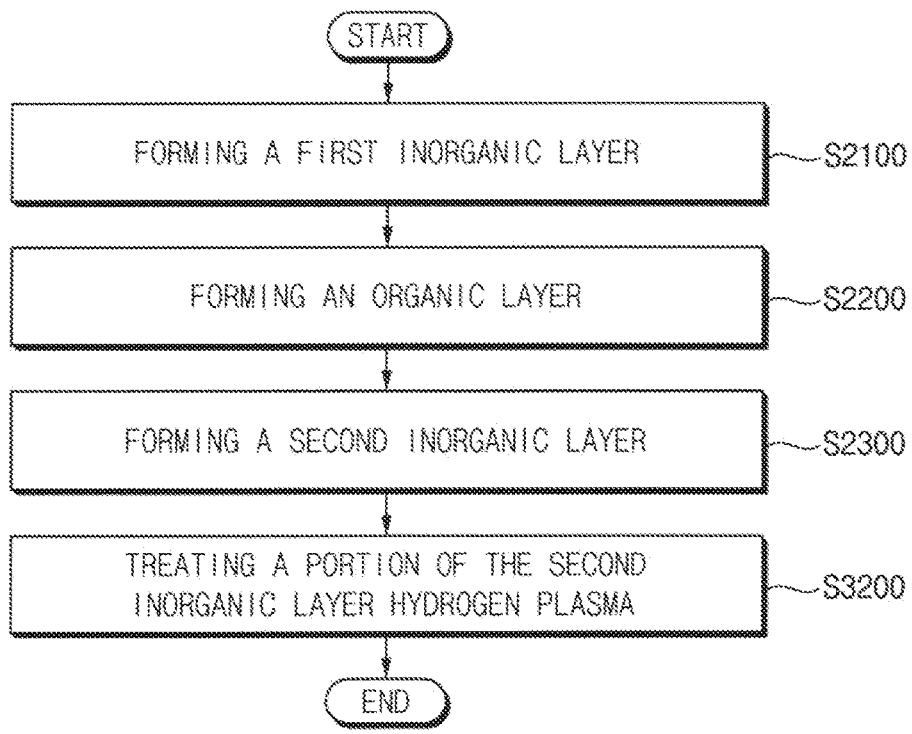
FIG. 8 is a flow chart illustrating an embodiment of the method of manufacturing the display device after forming a light emitting structure on a substrate according to an embodiment of the present inventive concept.

FIG. 8 is a flow chart illustrating an embodiment of the method of manufacturing the display device 10 after forming a light emitting structure 150 on a substrate 100 (S1000 of FIG. 6).

Referring to FIGS. 4 and 8, after forming the light emitting structure 150 on the substrate 100 (S1000), the method of manufacturing the display device 10 may include forming a first inorganic layer 161 (S2100), forming an organic layer 162 (S2200), forming a second inorganic layer 163 (S2300), and treating a portion of the second inorganic layer 163 with hydrogen plasma (S3200). Accordingly, by changing the upper portion of the second inorganic layer 163, the second inorganic layer 163 may include or may be formed of the first barrier layer 161H and the second barrier layer 161L.

Figure 9:
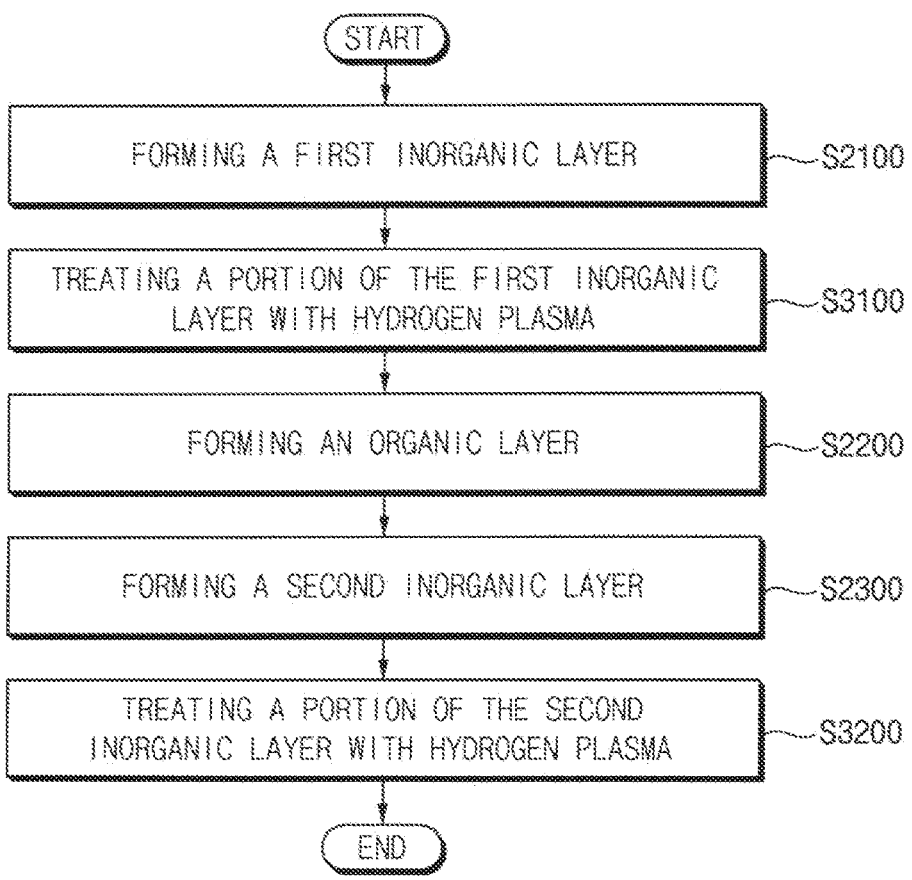
FIG. 9 is a flow chart illustrating an embodiment of the method of manufacturing the display device after forming a light emitting structure on a substrate according to an embodiment of the present inventive concept.

FIG. 9 is a flow chart illustrating an embodiment of the method of manufacturing the display device 10 after forming a light emitting structure 150 on a substrate 100 (S1000 of FIG. 6).

Referring to FIGS. 5 and 9, after forming the light emitting structure 150 on the substrate 100 (S1000), the method of manufacturing the display device 10 may include forming a first inorganic layer 161 (S2100), treating a portion of the first inorganic layer 161 with hydrogen plasma (S3100), forming an organic layer 162 (S2200), forming a second inorganic layer 163 (S2300), and treating a portion of the second inorganic layer 163 with hydrogen plasma (S3200). Accordingly, by changing the upper portion of the first inorganic layer 161, the first inorganic layer 161 may include the first barrier layer 161H and the second barrier layer 161L. By changing the upper portion of the second inorganic layer 163, the second inorganic layer 163 may include or may be formed of the first barrier layer 161H and the second barrier layer 161L.

The technical idea of the invention is that by treating with hydrogen plasma on an inorganic material containing silicon oxynitride to reduce dangling bonds of the inorganic material, increasing the stress intensity factor of the inorganic material to obtain excellent mechanical strength, decreasing the spin density of the inorganic material to obtain excellent sealing capability, and not changing the refractive index of the inorganic material to maintain excellent transmittance. Accordingly, the inorganic material included in the display device 10 such as the buffer layer 110, the gate insulating layer 120, and the interlayer insulating layer 130 may also improve sealing capability, and mechanical strength through treating with hydrogen plasma.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a light emitting structure disposed on a substrate; and
   a thin film encapsulation layer disposed on the light emitting structure and including an inorganic layer that contains silicon oxynitride and an organic layer,
   wherein a portion of the inorganic layer has a stress intensity factor of about 1.6 MPa or more,
   wherein the inorganic layer includes:
      a first inorganic layer disposed between the light emitting structure and the organic layer and containing silicon oxynitride; and
      a second inorganic layer disposed on the organic layer and containing silicon oxynitride,
   wherein the first inorganic layer includes:
      a first barrier layer contacting the organic layer; and
      a second barrier layer contacting the light emitting structure,
   wherein the first barrier layer is disposed between the organic layer and the second barrier layer, and
   wherein a number of dangling bonds of the first barrier layer is less than a number of dangling bonds of the second barrier layer.

2. The display device of claim 1,
   wherein the inorganic layer has a refractive index of about 1.8 or less.

3. The display device of claim 1,
   wherein a portion of the first inorganic layer has a stress intensity factor of about 1.6 MPa or more.

4. The display device of claim 1,
   wherein a portion of the second inorganic layer has a stress intensity factor of about 1.6 MPa or more.

5. The display device of claim 1,
   wherein the first barrier layer has a stress intensity factor of about 1.6 MPa or more; and wherein the second barrier layer has a stress intensity factor of less than about 1.6 MPa.

6. The display device of claim 5,
wherein a difference between a refractive index of the first barrier layer and a refractive index of the second barrier layer is less than about 0.05.

7. A display device comprising:
a light emitting structure disposed on a substrate; and
a thin film encapsulation layer disposed on the light emitting structure and including an inorganic layer that contains silicon oxynitride and an organic layer,
wherein a portion of the inorganic layer has a spin density of less than about $9.0 \times 1018$ spins/cm3,
wherein the inorganic layer includes:
　a first inorganic layer disposed between the light emitting structure and the organic layer and containing silicon oxynitride; and
　a second inorganic layer disposed on the organic layer and containing silicon oxynitride,
wherein the first inorganic layer includes:
　a first barrier layer contacting the organic layer; and
　a second barrier layer contacting the light emitting structure,
wherein the first barrier layer is disposed between the organic layer and the second barrier layer, and
wherein a number of dangling bonds of the first barrier layer is less than a number of dangling bonds of the second barrier layer.

8. The display device of claim 7,
wherein the first barrier layer has a spin density of less than about $9.0 \times 10^{18}$ spins/cm$^3$ and the second barrier layer has a spin density of about $9.0 \times 10^{18}$ spins/cm$^3$ or more.

9. The display device of claim 8,
wherein the first barrier layer has a stress intensity factor of about 1.6 MPa or more, and
wherein the second barrier layer has a stress intensity factor of less than about 1.6 MPa.

10. The display device of claim 8,
wherein each of a refractive index of the first barrier layer and a refractive index of the second barrier layer is about 1.8 or less, and
wherein a difference between the refractive index of the first barrier layer and the refractive index of the second barrier layer is less than about 0.05.

11. The display device of claim 8,
wherein the first barrier layer is not oxidized under a temperature of about 85° C. and a humidity of about 85% for about 500 hours.

* * * * *